(12) United States Patent
Chediak et al.

(10) Patent No.: US 6,380,063 B1
(45) Date of Patent: Apr. 30, 2002

(54) RAISED WALL ISOLATION DEVICE WITH SPACER ISOLATED CONTACTS AND THE METHOD OF SO FORMING

(75) Inventors: Juan A. Chediak, Berkeley, CA (US); Thomas G. Ference, Essex Junction, VT (US); Kurt R. Kimmel, Jericho, VT (US); Alain Loiseau, Williston, VT (US); Randy W. Mann, Jericho, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/516,697

(22) Filed: Mar. 1, 2000

(51) Int. Cl.[7] .......................................... H01L 21/4763
(52) U.S. Cl. ....................... 438/621; 438/221; 438/296; 438/424; 438/620; 438/655
(58) Field of Search ................................ 438/296, 299, 438/303, 230, 221, 424, 618, 620, 621, 655

(56) References Cited

U.S. PATENT DOCUMENTS

| | | | |
|---|---|---|---|
| 4,963,502 A | 10/1990 | Teng et al. | |
| 5,210,047 A | 5/1993 | Woo et al. | |
| 5,376,578 A | 12/1994 | Hsu et al. | |
| 5,385,857 A | 1/1995 | Solo de Zaldivar | |
| 5,466,636 A | 11/1995 | Cronin et al. | |
| 5,539,229 A | 7/1996 | Noble, Jr. et al. | |
| 5,620,919 A | 4/1997 | Godinho et al. | |
| 5,677,231 A | 10/1997 | Maniar et al. | |
| 5,706,164 A | * 1/1998 | Jeng | |
| 5,801,082 A | 9/1998 | Tseng | |
| 5,867,420 A | 2/1999 | Alsmeier | |
| 5,874,328 A | * 2/1999 | Liu et al. | |
| 5,894,169 A | 4/1999 | Givens et al. | |
| 5,908,315 A | * 6/1999 | Gardner et al. | |
| 5,950,090 A | * 9/1999 | Chen et al. | |
| 6,090,673 A | * 7/2000 | Allen et al. | |
| 6,110,787 A | * 8/2000 | Chan et al. | |

OTHER PUBLICATIONS

Stanley Wolf and Richard N. Tauber, "Silicon Processing for the VLSI Era, vol. 1: Process Technology," Lattice Press, Sunset Beach, California, 1986, pp. 308, 397–399.*

* cited by examiner

*Primary Examiner*—Charles Bowers
*Assistant Examiner*—Stephen W. Smoot
(74) *Attorney, Agent, or Firm*—Schmeiser, Olsen & Watts; William D. Sabo

(57) ABSTRACT

A semiconductor device having borderless contacts thereby providing a device having a reduced overall size. In particular, the device includes a plurality of shallow trench isolations and a plurality of dielectric isolations thereon to separate the adjoining device components and prevent shorts. Sidewall spacers surrounding and extend slightly above the device gates and dielectric isolations to further prevent shorts. A layer of conductive material atop each gate and diffusion region provides for coplanar contact surfaces. A layer of silicide beneath select regions of the conductive layer enhance electrical conductivity within the device. An internal wireless interconnection to electrically connect diffusion regions of different logic devices within the structure is also provided.

29 Claims, 8 Drawing Sheets

US 6,380,063 B1

RAISED WALL ISOLATION DEVICE WITH SPACER ISOLATED CONTACTS AND THE METHOD OF SO FORMING

BACKGROUND OF THE INVENTION

1. Technical Field

The present invention relates generally to semiconductor devices, and more particularly, to a method of reducing the gate to source/drain (hereinafter "S/D") contact spacing, thereby reducing the overall size of the device.

2. Related Art

There is an ever-present need in the semiconductor industry to reduce the size of integrated circuits, while maintaining reliability. FIG. 1 shows a related art CMOS logic device 10. The device 10 is constructed of a substrate 12, having a plurality of source/drain (S/D) regions 14 therein. A highly conductive layer 16 is located within the S/D regions 14. A gate oxide layer 17 is deposited over the surface of the substrate 12. A gate 18 is formed on the substrate 12, over the gate oxide layer 17, in areas between the S/D regions 14. Each gate 18 has a highly conductive layer 20 thereon, and a spacer 22 on each side which are approximately the same height as the gate 18. An insulative layer 28 is deposited over the spacers 22 and the gates 18. A gate contact 24, having a depth d, contacts each gate 18. A S/D contact 26, having a depth D, contacts the highly conductive layer 16 within the S/D regions 14, located between the gates 18. Because the highly conductive layers 16, 20 are at different depths (D and d, respectively), within the device 10, the height and aspect ratio of the S/D contact 26 must be considerably greater than the height and aspect ratio of the gate contacts 24.

As FIG. 1 illustrates, size reduction is limited because there is a minimum amount of gate to S/D contact spacing S required to prevent electrical connection between the gate contacts 24 and the S/D contact 26, which would produce a short within the device 10. Contributing to this limitation is what is referred to in the industry as "the canyon problem." The canyon problem arises because the highly conductive layers 16, 20 are not located at the same depth (D vs. d) within the device 10. As a result, the S/D contact hole 30 that forms the S/D contact 26 must be etched deeper than the contact hole 32 that form the gate contacts 24. Further, since it is typical for the contact holes 30, 32 to be produced having a slope of approximately 84° to 87° due to etching error, a minimum amount of space S between the contacts 24, 26 must be factored into the device to prevent electrical shorts.

Accordingly, there exists a need in the industry for a smaller, more compact, yet reliable semiconductor device, and a method of forming such a device.

SUMMARY OF THE INVENTION

In general, the present invention provides a reliable semiconductor device having a reduced overall size and a method of forming the same.

The first general aspect of the present invention provides a method of forming a semiconductor device, comprising the steps of: providing a substrate, having at least one shallow trench isolation therein, and a gate stack thereon; forming a gate and a dielectric isolation on the surface of the substrate; forming a non-conductive sidewall spacer on each side of the gate and dielectric isolation; forming at least one diffusion region within the substrate; removing a portion of the gate; depositing a silicide-forming layer over the surface of the logic device; depositing a conductive layer over the silicide-forming layer; planarizing the surface of the device to expose the dielectric isolations and spacers; and annealing the substrate to form a silicide layer between the conductive layer and each gate and diffusion region. This aspect allows for the production of a more compact device, having sidewall spacers, shallow trench isolations and dielectric isolations therein to protect against shorts. This aspect also provides a device having borderless contacts. In other words, contacts placed on the contact mounting surfaces of the substrate may overlap adjacent features within the device, namely, the sidewall spacers and the dielectric isolations, without producing an electrical short. This allows for the production of a device having contact mounting surfaces that can be smaller than the contacts placed thereon, as well as compensating for manufacturing errors, without producing shorts within the device. This aspect also provides sidewall spacers that extend above the contact mounting surfaces to further protect against shorts. In addition, this aspect provides a device wherein the gates and the isolations are coplanar, thereby providing substantially coplanar contact mounting surfaces, as well as providing contact mounting surfaces that are comprised of the same or similar materials. This allows for the use of contacts having uniform size and shape, thereby simplifying the manufacturing process, as well as solving the related art "canyon problem" mentioned above. Further, this aspect provides a layer of silicide between the conductive layer and each of the gates and dielectric isolations, thereby enhancing the conductivity of the device.

The second general aspect of the present invention provides a semiconductor device having substantially coplanar contact mounting surfaces, comprising: a substrate having at least one diffusion region and at least one dielectric filled trench therein; at least one gate on the surface of the substrate; at least one isolation on the surface of the substrate contacting the dielectric filled trenches; a plurality of spacers bordering the gate and the isolation; and a layer of conductive material between the spacers of the gates and isolations. This aspect provides a device created by the method described in the first aspect, having similar advantages.

The third general aspect of the present invention provides a method of forming a wireless interconnection within a semiconductor device, comprising the steps of: providing a substrate including at least two logic devices, having at least one diffusion region within each logic device; and forming a region within the substrate wherein the diffusion regions of at least two logic devices are electrically connected. This aspect provides a method of providing a wireless connection within the device produced using the method of the first aspect. This aspect allows for the internal electrical connection of logic cells, without the use of external wiring.

The fourth general aspect of the present invention provides a method of forming a semiconductor device having borderless contacts, comprising the steps of: providing a substrate having at least one shallow trench isolation and at least one diffusion region therein; providing at least one isolation on a first surface of the substrate, contacting the shallow trench isolations; providing at least one gate on the first surface of the substrate, wherein the gate and the isolations are coplanar; providing sidewall spacers for each of the at least one gate and isolations; and providing a planar layer of conductive material over the substrate. This aspect provides a device created by the method described in the first aspect, having similar advantages.

A fifth general aspect of the present invention provides a semiconductor device having borderless contacts therein, comprised of: at least one shallow trench isolation and at least one diffusion region within a substrate; a dielectric isolation on a surface of the substrate contacting the shallow trench isolations having at least one discontinuity therein; at least one gate on the surface of the substrate; a plurality of sidewall spacers contacting the gates and the isolations; and a layer of conductive material between the gates and the isolations. This aspect provides a semiconductor device produced from the method described in the fourth aspect, having advantages similar to those associated with the first and fourth aspects.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 2:
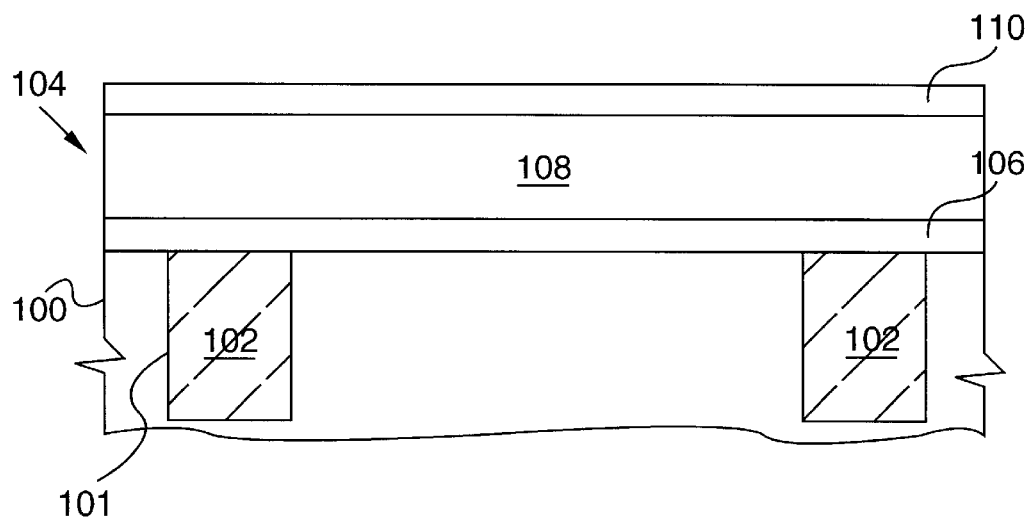
FIG. 2 depicts a semiconductor substrate in accordance with a preferred embodiment of the present invention.

Referring to the drawings, FIG. 2 shows a semiconductor substrate 100, preferably a silicon substrate, having two shallow trench isolations (hereinafter "STI") 102 therein, and a gate stack 104 thereon. Each STI 102 is formed by creating a bore or trench 101 within the substrate via conventional photolithography, and a conventional etching process, e.g., reactive ion etching. A dielectric material, preferably oxide, is deposited within each trench 101, preferably using a conventional low pressure chemical vapor deposition (CVD) process. The surface of each STI 102 is planarized, using chemical mechanical polishing ("CMP") techniques, such that each STI 102 is planar with the surface of the substrate 100. The gate stack 104 on the surface of the substrate 100 is formed using conventional deposition methods known and used in the art. The gate stack 104 preferably consists of a gate dielectric layer 106, a conductive layer 108, and an optional insulative layer 110. The gate dielectric layer 106 is preferably composed of an oxide, or similar material. The conductive layer 108 is preferably polysilicon, or comparable material. The insulative layer 110 is preferably composed of nitride, or other comparable material.

Figure 3:
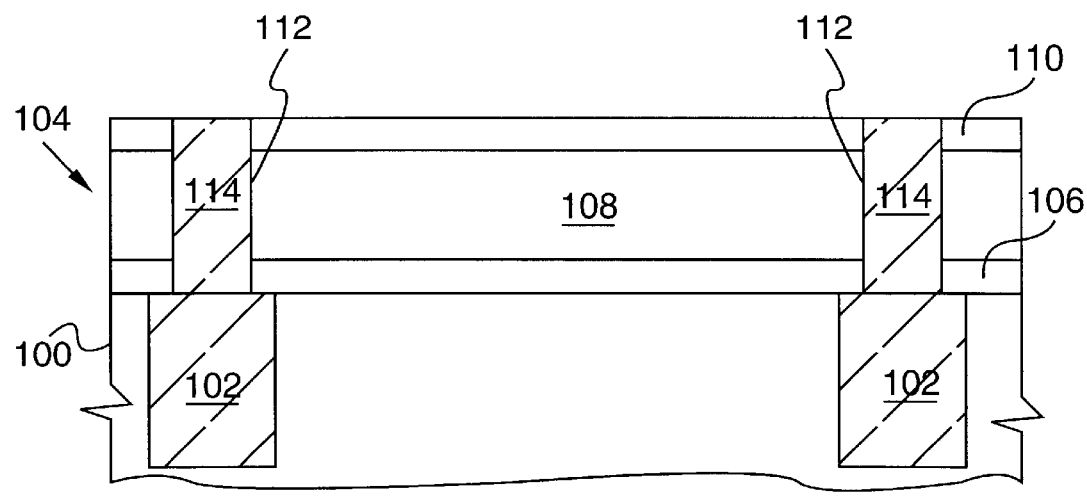
FIG. 3 depicts the formation of isolations in accordance with a preferred embodiment of the present invention.

Referring to FIG. 3, a pair of trenches 112 are formed within the gate stack 104 over the location of each STI 102. The trenches 112 are preferably formed by reactive ion etching (RIE) the gate stack 104 until the surface of each STI 102 is contacted. The trenches 112 are filled with a dielectric material 114, preferably silicon or oxide, using techniques well known in the industry. The dielectric material 114 is then planarized using CMP, or other well known techniques, wherein the insulative layer 110 of the gate stack 104 acts as a polish stop.

Figure 4:
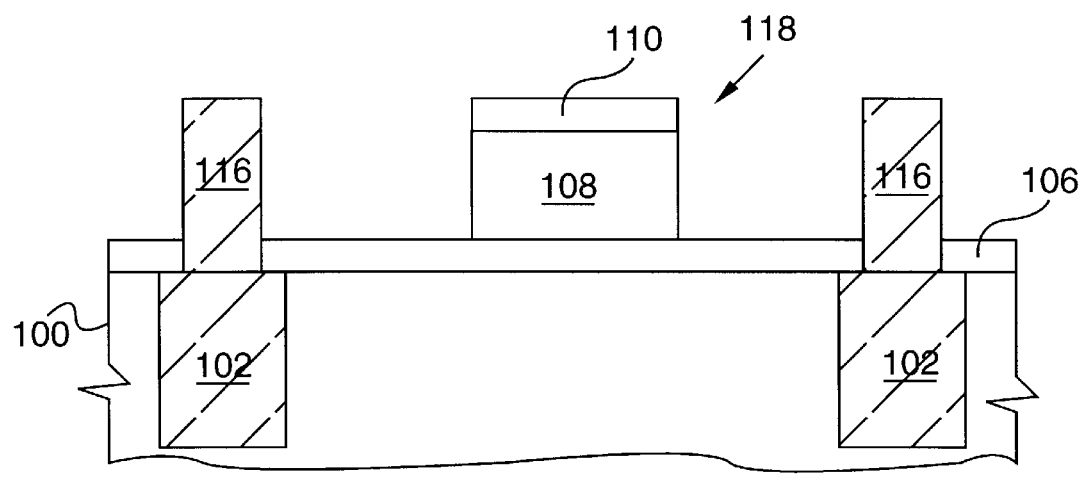
FIG. 4 depicts the formation of a gate in accordance with a preferred embodiment of the present invention.
Figure 5:
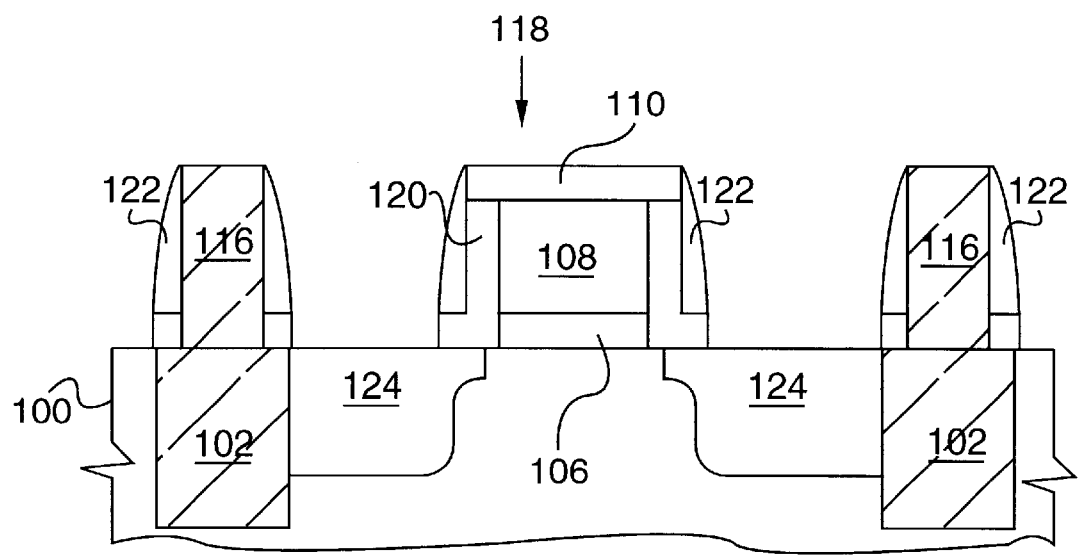
FIG. 5 depicts the formation of spacers and diffusion regions in accordance with a preferred embodiment of the present invention.
Figure 6:
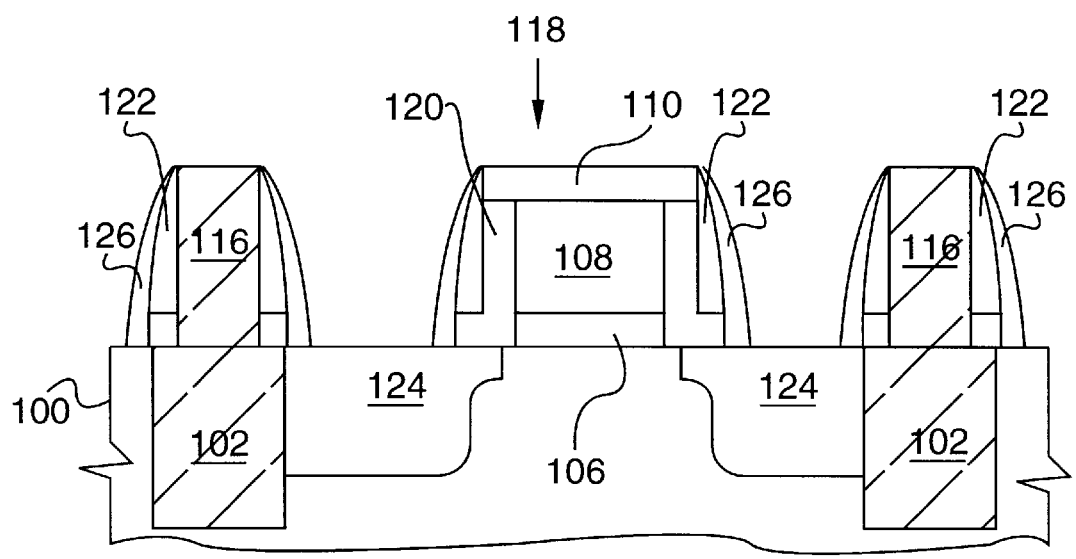
FIG. 6 depicts the formation of an additional spacer in accordance with a preferred embodiment of the present invention.

FIG. 4 shows the formation of a gate 118 and a pair of dielectric isolations 116 on the surface of the substrate 100. The gate stack 104 is selectively removed down to the gate oxide layer 106, using conventional photolithographic techniques, followed by an etch techniques known and used in the art, thereby leaving the gate 118 and isolations 116, which evolve from the dielectric filled trenches 114. In FIG. 5, a gate sidewall isolation layer 120 is deposited on each side of the gate 118 using a conventional technique known and used in the art. A first non-conductive sidewall spacer 122, preferably consisting of nitride, is formed on each side of the gate 118 and the isolations 116. In particular, a layer of conformal film is deposited over the surface of the gate 118 and the isolations 116. A RIE process is then performed to remove the unwanted portions leaving the spacers 122. The gate oxide layer 106 is then removed from the surface of the substrate 100 in exposed areas (areas not having a device feature thereon). Two diffusion regions, or in this example source/drain regions (S/D) 124 are then formed within the substrate via the implantation of arsenic or phosphorus ions, using ion implantation techniques common to the industry. A second sidewall spacer 126 may optionally be formed over the first spacer 122, as depicted in FIG. 6.

Figure 7:
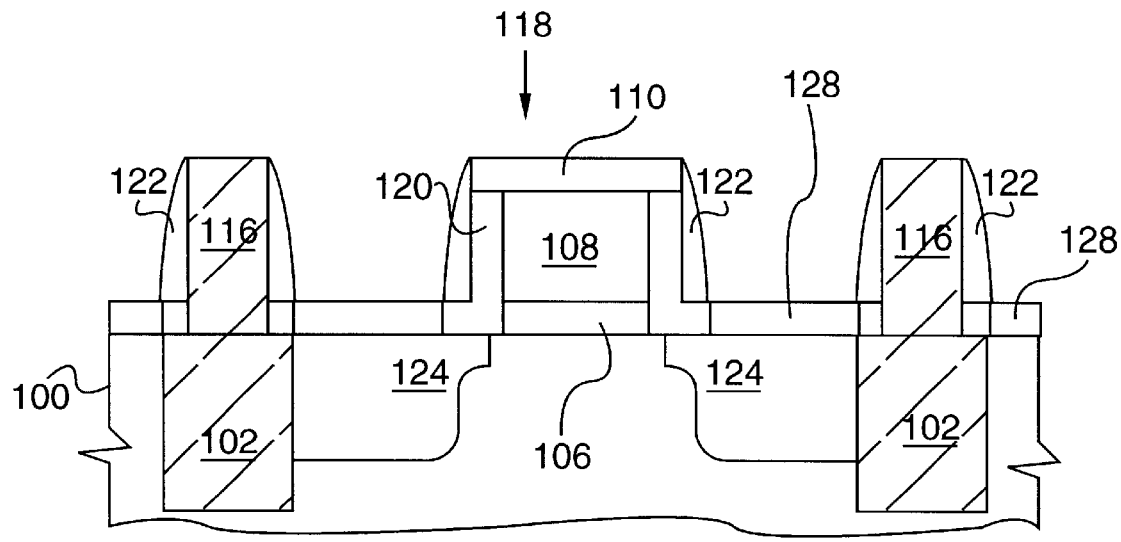
FIG. 7 depicts the deposition of a protective layer in accordance with a preferred embodiment of the present invention.
Figure 8:
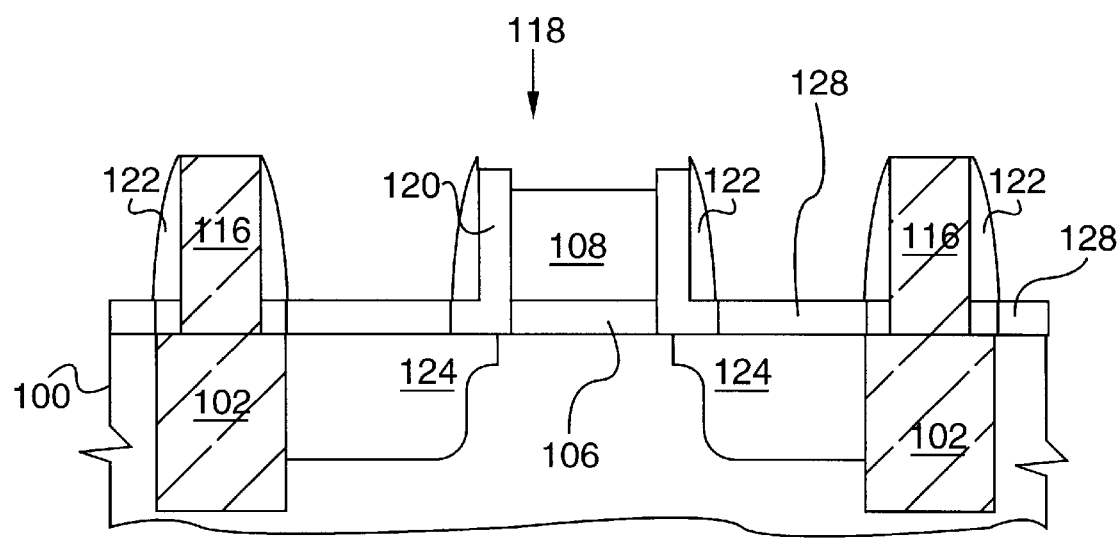
FIG. 8 depicts the removal of a portion of the gate in accordance with a preferred embodiment of the present invention.
Figure 9:
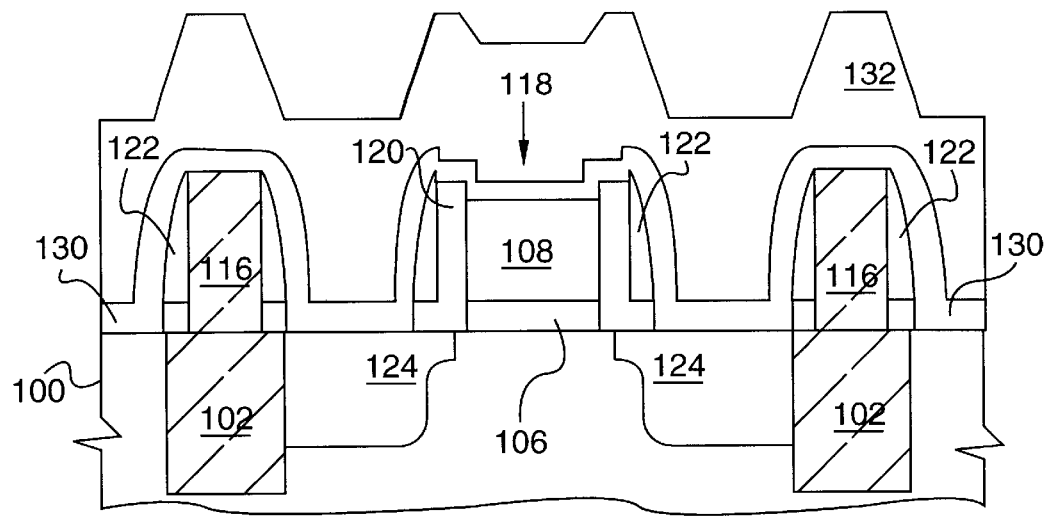
FIG. 9 depicts the deposition of a conductive material in accordance with a preferred embodiment of the present invention.
Figure 10:
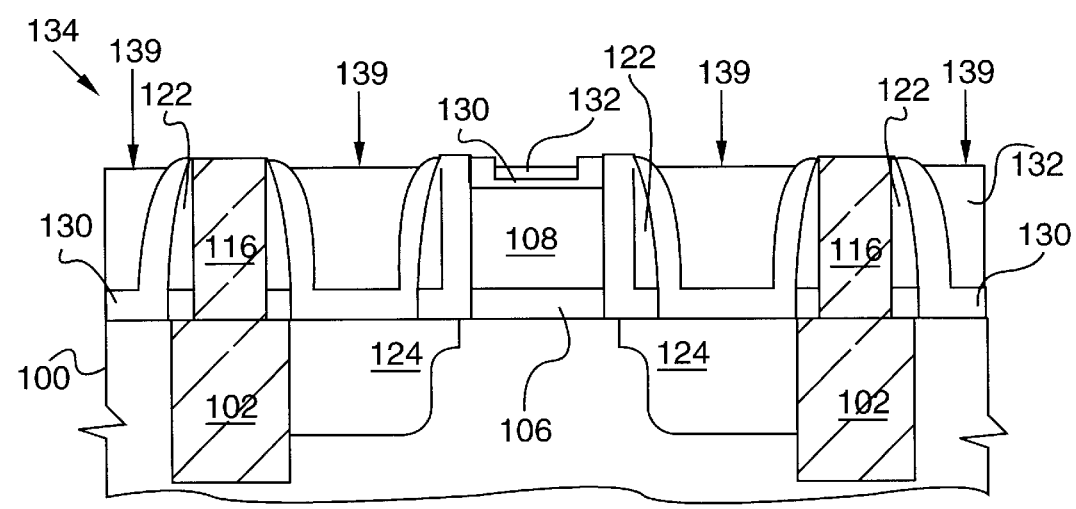
FIG. 10 depicts the planarization of the device in accordance with a preferred embodiment of the present invention.
Figure 11:
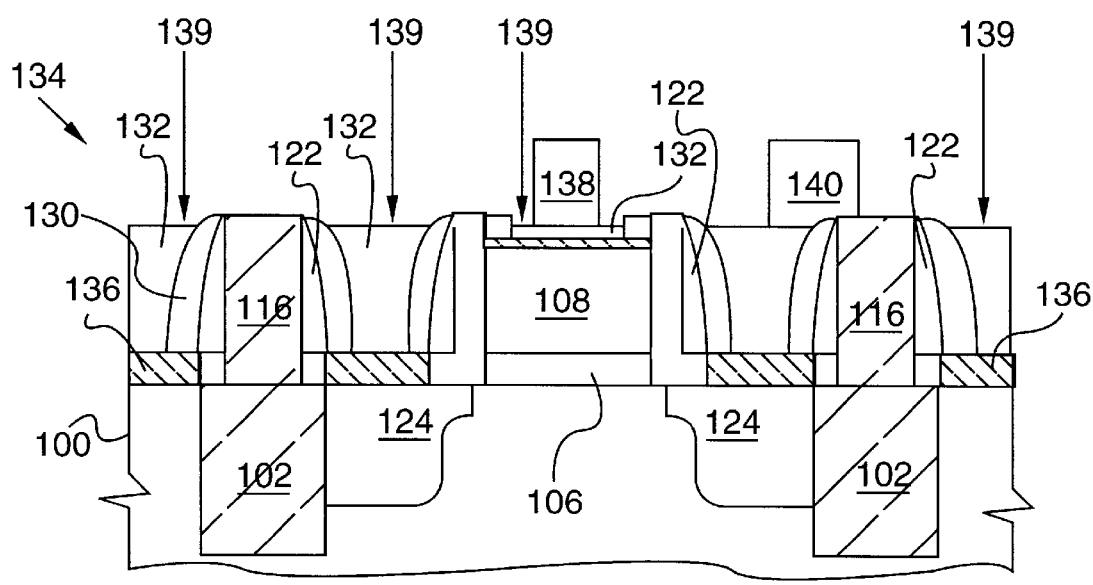
FIG. 11 depicts the formation of a silicide layer and contacts in accordance with a preferred embodiment of the present invention.

FIG. 7 shows a dielectric layer 128, preferably oxide, which is grown on the surface of the substrate in regions between the gate 118 and the isolations 116 to protect the S/D regions 124 during the subsequent etching step. The insulative layer 110 and a portion of the conductive layer 108 of the gate 118 are removed using a RIE etch back process, as illustrated in FIG. 8. The protective dielectric layer 128 covering the S/D regions 124 is then removed using another RIE process. As shown in FIG. 9, a layer 130 of silicide-forming metal, preferably titanium, or in the alternative cobalt, or tungsten is deposited over the surface of the gate 118, the isolations 116 and the spacers 122. A conductive layer 132, preferably tungsten, is then deposited over the layer 130 of silicide-forming metal. The conductive layer 132 is then planarized using a CMP process, to produce a device 134 having a plurality of contact mounting surfaces 139 thereon, as illustrated in FIG. 10. The contact mounting surfaces 139, located in the regions between the gate 118 and the isolations 116, are etched back slightly during the CMP process to prevent shorts from occurring within the device 134 when subsequent components are mounted thereon. The device 134 is then annealed using conventional processes. During the anneal, the layer 130 of silicide-forming metal is transformed into a silicide layer 136 beneath the contact mounting surfaces 139, as shown in FIG. 11. It should be noted that the layer 130 of silicide-forming metal will not form silicide on an insulative material, such as the isolations 116 and the sidewall spacers 122. The device 134 is then placed in a bath of dilute hydrofluoric acid to remove the portion of the layer 130 that did not form silicide, namely, in the regions covering the isolations 116 and the sidewall spacers 122 that are not covered by the conductive layer 132. The silicide layer 136 is desirable because it improves electrical conductivity within the device 134.

A plurality of contacts 138, 140 may then be mounted on the surface of the device 134, preferably on the contact mounting surfaces 139, as illustrated in FIG. 11. However, the device 134 formed by the process described above contains borderless contacts. In other words, when placing the contacts 138, 140 on the contact mounting surfaces 139 the contacts 138, 140 may overlap adjacent features within the device, namely, the sidewall spacers 122 and the isolations 116, without producing a short (as illustrated by the S/D contact 140 in FIG. 11). This allows for the production of a device 134 wherein the contact mounting surfaces 139 may have a smaller surface area than that of the contacts 138, 140, as well as compensating for manufacturing errors, without producing shorts within the device.

Figure 1:
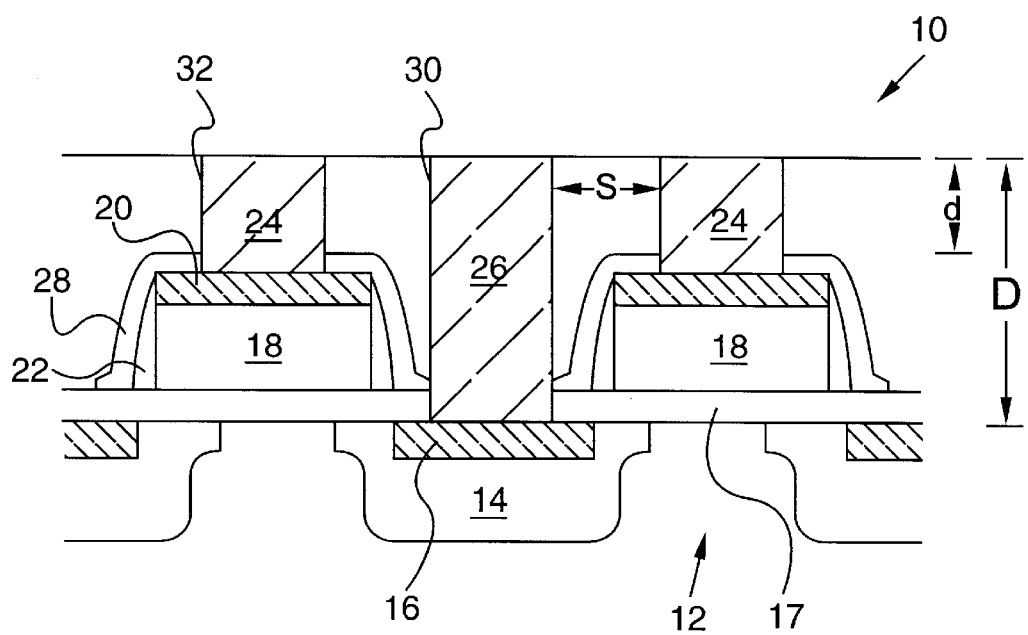
FIG. 1 depicts a related art CMOS logic device.

It should also be noted that the contacts 138, 140 mounted on the surface of the device 134 are approximately uniform in depth and shape, unlike the related art device 10 shown in FIG. 1. This uniformity is desirable because it provides for faster, easier and less expensive manufacturing.

Figure 12:
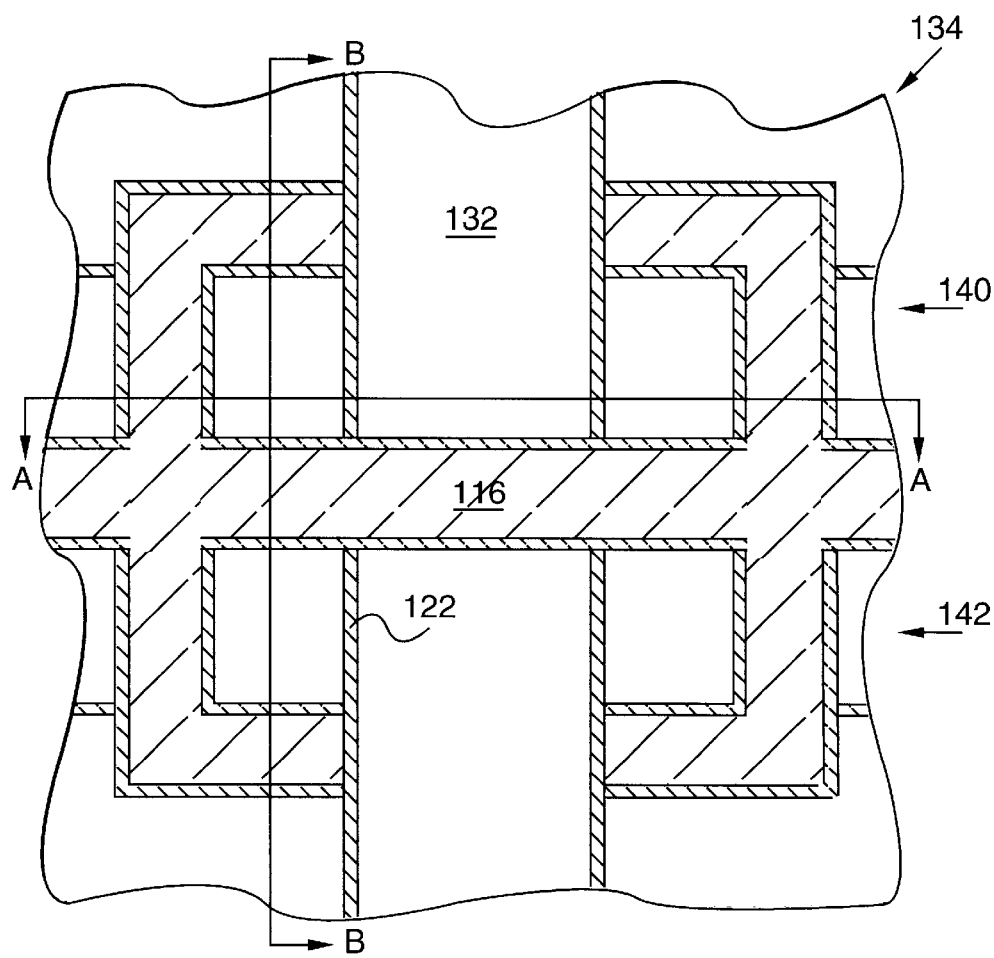
FIG. 12 depicts a plan view of the device in accordance with a preferred embodiment of the present invention.
Figure 13:
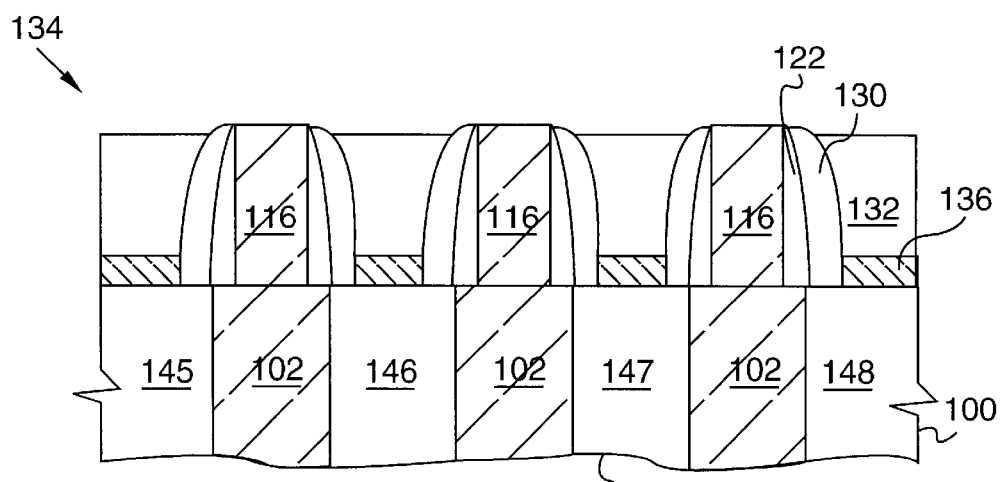
FIG. 13 shows a cross-sectional view of the device along line B—B of FIG. 12 in accordance with a preferred embodiment of the present invention.

FIG. 12 shows a plan view of the logic device 134 produced by the above described process, wherein FIGS. 2–11 are cross-sectional views taken along line A—A. The device 134, shown as an example only, contains two different logic cells therein, a PFET 140 and an NFET 142. It should be appreciated that FIG. 12 is merely a simplified example used for ease of description. The present disclosure is not limited to the quantity, type or layout of logic cells illustrated herein. FIG. 13 shows a cross-sectional view of the device 134 along line B—B. The device 134 contains S/D regions 124, labeled 145, 146, 147 and 148 surrounding the STIs 102, wherein S/D regions 145, 146, 147 and 148 are electrically isolated from one another.

Figure 14:
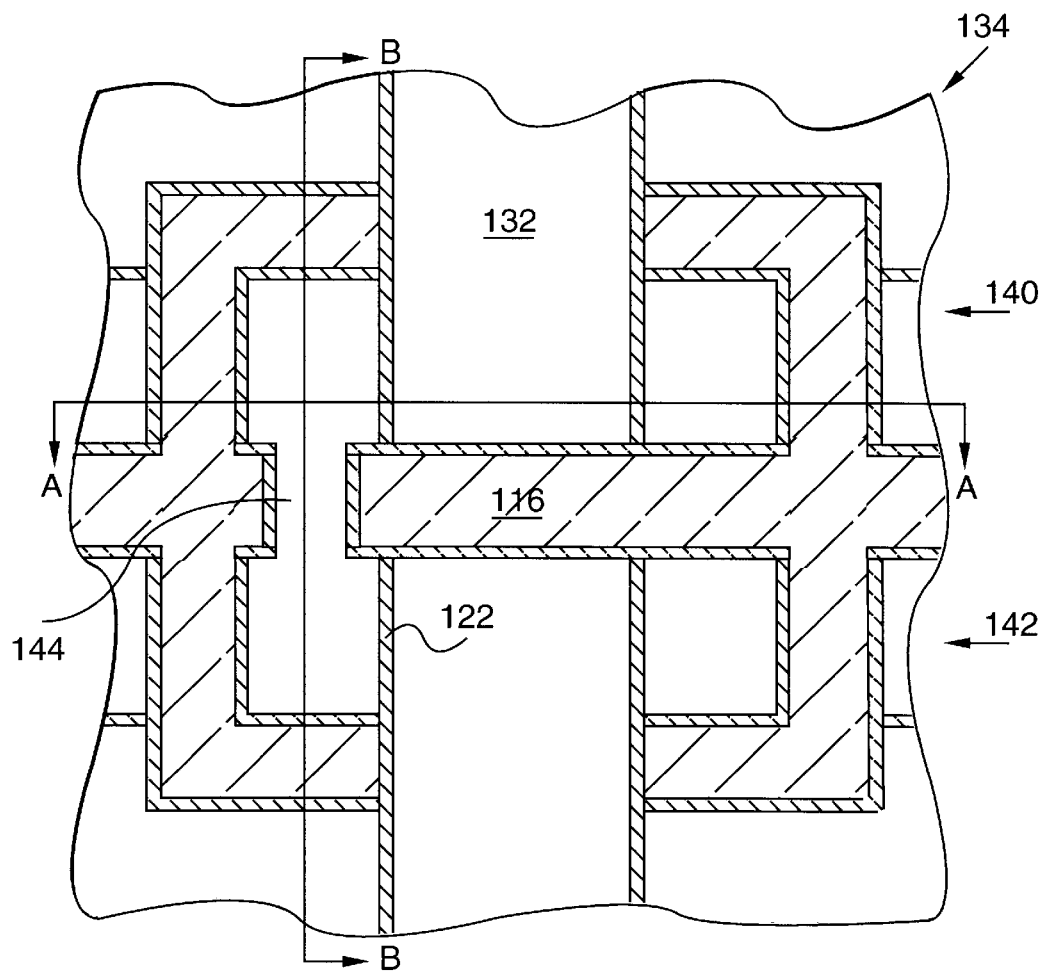
FIG. 14 depicts a plan view of the device in accordance with a second embodiment of the present invention.
Figure 15:
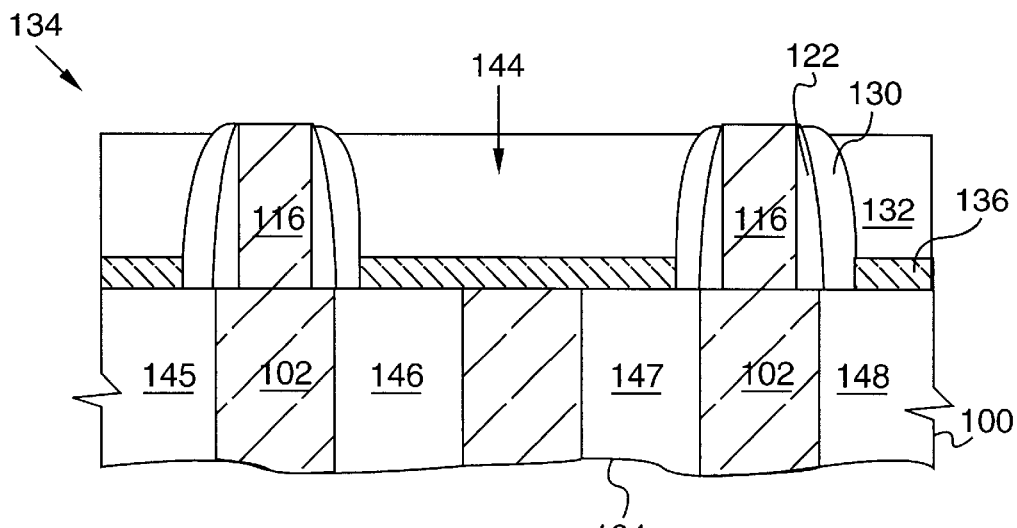
FIG. 15 shows a cross-sectional view of the device along line B—B of FIG. 14 in accordance with the second embodiment of the present invention.

FIG. 14 illustrates a variation of the plan view of the device 134 shown in FIG. 12 in order to describe a second embodiment of the present invention. In particular, FIG. 14 shows the device 134 having an interconnect 144 therein. The interconnect 144 is created by the absence of the dielectric isolation 116 and the corresponding spacers 122 in a selected region. This can be clearly seen in FIG. 15, which shows a cross-sectional view of the modified device 134 of FIG. 14, taken along line B—B, having the interconnect 144 therein. While S/D regions 145 and 148 are still isolated from 146 and 147, as well as from one another, S/D regions 146 and 147 are now electrically connected to one another. The interconnect 144 allows the S/D regions 124 of two different logic cells, in this example the PFET 140 and the NFET 142, to be connected without the need for external wiring. Using the interconnect 144 multiple cells within the device 134 can be internally connected with much more ease and reliability.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A method of forming a semiconductor device, comprising the steps of:
   providing a substrate, having at least one shallow trench isolation therein, and a gate stack thereon;
   forming a gate and a dielectric isolation on the surface of the substrate;
   forming a non-conductive sidewall spacer on each side of the gate and dielectric isolation;
   forming at least two diffusion regions within the substrate;
   removing a portion of the gate;
   depositing a silicide-forming layer over the surface of the semiconductor device;
   depositing a conductive layer over the silicide-forming layer;
   providing at least one interconnect within the conductive layer thereby electrically connecting the diffusion regions within the device;
   planarizing the surface of the device to expose the dielectric isolation and spacers; and
   annealing the substrate to form a silicide layer between the conductive layer and each gate and diffusion region.

2. The method of claim 1, wherein the dielectric isolation is aligned over and contact the at least one shallow trench isolation.

3. The method of claim 1, wherein the substrate is comprised of silicon.

4. The method of claim 1, wherein the step of providing the at least one shallow trench isolation further includes the steps of:
   creating at least one bore in the substrate;
   depositing a dielectric material in the bore; and
   planarizing the surface of the dielectric material.

5. The method of claim 4, wherein the at least one bore is formed via photolithography.

6. The method of claim 4, wherein the dielectric material is planarized via chemical mechanical polishing.

7. The method of claim 1, wherein the gate stack is comprised of a layer of dielectric material, a layer of conductive material over the dielectric material, and a layer of insulative material over the conductive material.

8. The method of claim 7, wherein the dielectric material is comprised of oxide.

9. The method of claim 7, wherein the conductive material is comprised of polysilicon.

10. The method of claim 7, wherein the insulative material is comprised of nitride.

11. The method of claim 7, wherein the insulative layer functions as an etch stop during the formation of the dielectric isolations.

12. The method of claim 1, wherein the step of forming the gate further includes the step of:

selectively removing a portion of the gate stack.

13. The method of claim 12, wherein the step of selectively removing a portion of the gate stack to form the gate is performed by photolithography.

14. The method of claim 1, wherein the step of forming the dielectric isolation further includes the steps of:

forming a bore in select regions of the gate stack;

depositing a dielectric in the bore;

planarizing the dielectric; and selectively removing a portion of the gate stack.

15. The method of claim 14, wherein the step of selectively removing a portion of the gate stack to form the dielectric isolation is performed by photolithography.

16. The method of claim 1, wherein the step of forming at least two diffusion regions further includes the step of:

implanting ions in select regions of the substrate.

17. The method of claim 16, wherein the ions implanted in select regions of the substrate to form diffusion regions are selected from the group consisting of: arsenic and phosphorus.

18. The method of claim 1, wherein the at least two diffusion regions are selected from the group consisting of: a source region and a drain region.

19. The method of claim 1, wherein the step of forming the non-conductive sidewall spacers further includes the steps of:

depositing a film over the surface of the gate and the dielectric isolation; and selectively removing portions of the film.

20. The method of claim 1, wherein a second plurality of sidewall spacers may optionally be formed over the non-conductive sidewall spacers.

21. The method of claim 1, wherein the step of removing a portion of the gate is accomplished via an etch back process.

22. The method of claim 1, wherein the step of planarizing the surface of the device to expose the dielectric isolation and spacers is accomplished by chemical mechanical polishing the surface of the device.

23. The method of claim 1, wherein the interconnection is formed between at least two diffusion regions by selectively omitting portions of the dielectric isolation and spacers therebetween.

24. A method of forming a wireless interconnection within a semiconductor device, comprising the steps of:

providing a substrate including at least two logic devices, having at least one diffusion region within each logic device;

forming a region within the substrate wherein the diffusion regions of at least two logic devices are electrically connected;

forming an isolation between the diffusion regions of the logic devices; and selectively omitting the isolation in a region of desired electrical connection.

25. A method of forming a wireless interconnection within a semiconductor device, comprising the steps of;

providing a substrate including at least two logic devices, having at least one diffusion region within each logic device;

forming a region within the substrate wherein the diffusion regions of at least two logic devices are electrically connected;

forming an isolation between the diffusion regions of the logic devices, wherein the isolations are comprised of an insulative material; and selectively omitting the isolation in a region of desired electrical connection.

26. The method of claim 25, wherein the two logic devices are selected from the group consisting of: PFET and NFET logic devices.

27. The method of claim 25, wherein the diffusion regions are source/drain regions.

28. A method of forming a semiconductor device having borderless contacts, comprising the steps of:

providing a substrate having at least one shallow trench isolation and at least one diffusion region therein;

providing at least one isolation on a first surface of the substrate, contacting the shallow trench isolation;

providing at least one gate on the first surface of the substrate, wherein the gate and the at least one isolation on the first surface are coplanar;

providing sidewall spacers for each of the at least one gate and at least one isolation on the first surface;

selectively omitting a portion of the at least one isolation on the first surface in select areas of the device, thereby internally electrically connecting the select areas; and providing a planar layer of conductive material over the substrate.

29. The method of claim 28, further including the step of:

producing a layer of silicide between the layer of conductive material and each of the gates and the diffusion regions.

* * * * *